United States Patent
Chen et al.

(10) Patent No.: US 8,018,772 B2
(45) Date of Patent: Sep. 13, 2011

(54) APPARATUS AND METHOD FOR DETECTING WORD LINE LEAKAGE IN MEMORY DEVICES

(75) Inventors: Han-Sung Chen, Hsinchu (TW);
Su-Chueh Lo, Miaoli (TW);
Chun-Hsiung Hung, Hsinchu (TW);
Nai-Ping Kuo, Hsinchu (TW);
Ming-Chih Hsieh, Hsinchu (TW);
Wen-Pin Tsai, Taipai (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/899,439

(22) Filed: Oct. 6, 2010

(65) Prior Publication Data
US 2011/0019487 A1    Jan. 27, 2011

Related U.S. Application Data

(63) Continuation of application No. 12/421,523, filed on Apr. 9, 2009, now Pat. No. 7,835,178, which is a continuation of application No. 11/845,690, filed on Aug. 27, 2007, now Pat. No. 7,532,513.

(51) Int. Cl.
*G11C 11/34* (2006.01)
(52) U.S. Cl. ......... 365/185.18; 365/189.07; 365/185.25; 365/189.09
(58) Field of Classification Search ............. 365/185.18, 365/185.25, 189.07, 189.09
See application file for complete search history.

(56) References Cited

U.S. PATENT DOCUMENTS

| | | | |
|---|---|---|---|
| 5,117,426 A | 5/1992 | McAdams | |
| 5,359,558 A | 10/1994 | Chang et al. | |
| 6,222,768 B1 | 4/2001 | Hollmer et al. | |
| 6,768,679 B1 | 7/2004 | Le et al. | |
| 7,023,734 B2 | 4/2006 | Chen Chung-Zen | |
| 7,272,035 B1 | 9/2007 | Chen et al. | |
| 7,403,442 B2* | 7/2008 | Larguier et al. | 365/230.06 |
| 7,532,513 B2 | 5/2009 | Chen et al. | |
| 2008/0192545 A1 | 8/2008 | Chen Chung-Zen | |
| 2009/0225607 A1 | 9/2009 | Chen et al. | |
| 2010/0125429 A1* | 5/2010 | Yamada | 365/185.18 |

OTHER PUBLICATIONS

Notice of Allowance for U.S. Appl. No. 12/421,523, mailed on Jul. 8, 2010, 7 pages.
Notice of Allowance for U.S. Appl. No. 11/845,690, mailed on Jan. 2, 2009, 6 pages.

* cited by examiner

*Primary Examiner* — Tuan T. Nguyen
(74) *Attorney, Agent, or Firm* — Kilpatrick Townsend and Stockton LLP

(57) ABSTRACT

According to an embodiment of the present invention, a method for detecting word line leakage in a memory device includes coupling a first word line in the memory device to a voltage source while coupling a second word line in the memory device to a ground level voltage. Next, the first word line is decoupled from the voltage source. The method also includes comparing a current of the first word line with a predetermined reference current for determining a leakage condition of the word line.

20 Claims, 17 Drawing Sheets

APPARATUS AND METHOD FOR DETECTING WORD LINE LEAKAGE IN MEMORY DEVICES

CROSS-REFERENCES TO RELATED APPLICATIONS

This application is a continuation application of U.S. patent application Ser. No. 12/421,523, filed Apr. 9, 2009, entitled "Apparatus And Method For Detecting Word Line Leakage In Memory Devices," now U.S. Pat. No. 7,532,513, which is a continuation application of U.S. patent application Ser. No. 11/845,690, filed Aug. 27, 2007, entitled "Apparatus And Method For Detecting Word Line Leakage In Memory Devices," both of which are commonly assigned and incorporated herein by reference.

BACKGROUND OF THE INVENTION

The present invention is directed generally to integrated circuits. More particularly, the invention provides a method and apparatus for leakage current testing for integrated circuit memory devices. Merely by way of example, the invention provides techniques for monitoring cell current in a memory device for detecting word line leakage cause by process defects. But it would be recognized that the invention has a much broader range of applicability. For example, the present invention can be applied for testing other leakage conditions in integrated circuit memory devices.

FIG. 1 is a block diagram illustrating a conventional memory device 100. As shown, memory device 100 includes a word line power generator 101 coupled to memory sectors 110, 111, . . . , 119, etc. During memory operation, word line power generator 101 maintains a voltage required by the word lines. For example, during a read operation, a read voltage level is required. As is known, leakage conditions often exist in a memory device. Conventionally, the leakage conditions are often determined by monitoring power consumption of the memory device. As discussed below, conventional techniques have various limitations, and an improved technique for memory leakage testing is desired.

BRIEF SUMMARY OF THE INVENTION

The present invention is directed generally to integrated circuits. More particularly, the invention provides a method and apparatus for leakage current testing for integrated circuit memory devices. Merely by way of example, the invention provides techniques for monitoring cell current in a memory device for detecting word line leakage cause by process defects. But it would be recognized that the invention has a much broader range of applicability. For example, the present invention can be applied for testing other leakage conditions in integrated circuit memory devices.

According to a specific embodiment, the invention provides a method for detecting word line leakage in a memory device. The method includes coupling a first plurality of word lines in the memory device to a voltage source while coupling a second plurality of word lines in the memory device to a ground level voltage. Each of the second plurality of word lines is adjacent to a corresponding one of the first plurality of word lines. The method includes waiting for a first predetermined period of time to allow the first plurality of word lines to reach a predetermined read voltage level. For example, the predetermined read voltage level may be a word line voltage level for a memory read operation. After the word lines have reached the predetermined voltage level, the first plurality of word lines are decoupled from the voltage source. Then a wait time is elapsed for a second predetermined period of time to allow the first plurality of word lines to discharge. At this point, the word line voltage level will have dropped due to intrinsic leakage such as junction leakage or due to extrinsic leakage conditions caused by, for example, process defects. The method then includes sensing a current associated with the first plurality of word lines and comparing the current with a predetermined reference current. The predetermined reference current is selected for identifying a word line leakage condition associated with the first plurality of word lines. The method further includes determining whether the word line leakage condition exists. For example, if the sensed current is higher than the predetermined reference current, then a leakage condition can be determined to exist. An example of this embodiment is shown in FIGS. 10-13.

In a specific embodiment, the first plurality of word lines and the second plurality of word lines are selected from a memory array in the memory device. In an example, the memory array is coupled to the voltage source through an array select switch. In an embodiment, each of the first and second plurality of word lines includes a word line driver device, which is capable of being coupled to the voltage source or to the ground level voltage, for example, using decoding circuit known in the art. In a specific example, the first plurality of word lines includes even-numbered word lines in the memory device, and the second plurality of word lines includes odd-numbered word lines in the memory device. In an embodiment, sensing the current includes performing a memory read operation to determine a current associated with a bit line coupled to the first plurality of word lines. The parameters for testing are selected for specific testing conditions. For example, in an embodiment, the second predetermined period of time is selected to allow a voltage associated with the first plurality of word lines to be discharged for identifying the word line leakage condition. In a particular example, the second predetermined period of time is about several to hundreds μsec according to the detecting leakage criterion and word line capacitance. In an embodiment, the predetermined reference current is selected to be higher than intrinsic leakage current associated with the first plurality of word lines as well as proper working range applies to sense amplifier. In another specific embodiment, the predetermined reference current is about 10 μA.

According to another embodiment, the invention provides a method for detecting word line leakage in a memory device which includes a first plurality of word lines. The method includes selecting a first word line from the first plurality of word lines in the memory device and coupling the first word line in the memory device to voltage source while grounding the second plurality of word lines in the memory array. The method includes waiting for a first predetermined period of time to allow the first word line to reach a predetermined read voltage level. The method includes decoupling the first word line from the voltage source and coupling the first word line to a floating voltage terminal. After waiting for a second predetermined period of time to allow the first word line to discharge, the method includes sensing a current associated with the first word line and comparing the sensed current with a predetermined reference current to identify a word line leakage condition. The predetermined reference current is selected for identifying a word line leakage condition. The method also includes determining whether the word line leakage condition exists. In a specific embodiment, the plurality of word lines are coupled to the voltage source through an array selection switch device. In an embodiment, coupling the first word line to a voltage source comprises turning on a word line selection switch. In a specific embodiment, coupling the first word line to a floating voltage terminal comprises coupling the first word line to a terminal of an off-state MOSFET. In an embodiment the second predetermined period of time is about several to hundreds μsec according to the detecting leakage criterion and word line capacitance. In an embodiment, the predetermined reference current is about 10 μA. An example of this embodiment is shown in FIGS. 14-17.

In yet another embodiment, the invention provides a method for detecting word line leakage in a memory device. The method includes coupling one or more word lines in the memory device to a voltage source, while coupling at least a corresponding word line adjacent to each of the one or more word lines to a ground voltage. The method includes waiting for a first predetermined period of time to allow the one or more word lines to reach a predetermined read voltage level before decoupling the one or more word lines from the voltage source. The method includes waiting for a second predetermined period of time to allow the one or more word lines to discharge, and then comparing a voltage associated with the one or more word lines with a reference voltage, which is selected for identifying a word line leakage condition associated with the one or more word lines. The method further includes determining whether the word line leakage condition exists. In a specific embodiment, the memory device includes a switch device and a comparator circuit. The switch device couples the one or more word lines in the memory device to either the voltage source or the comparator circuit in response to a memory leakage testing command. In another embodiment, the memory device includes a plurality of memory arrays. In this embodiment, the memory device further includes a switch device associated with each of the plurality of memory arrays and a comparator circuit. Each of the switch devices couples the one or more word lines in a corresponding memory array to either the voltage source or the comparator circuit in response to a memory leakage testing command. An example of this embodiment is shown in FIGS. 4-9.

According to some embodiments, the present invention provides a memory device including a first memory array having a first word line and a comparator circuit having a first terminal coupled to a reference voltage and a second terminal coupled to a first switch selectively coupling the first word line to a power source or the second terminal. In an embodiment, the reference voltage is selected for identifying a leakage condition associated with the first word line. In another embodiment, the first switch is configured to couple the first word line to the power source for a first predetermined period of time to allow charging of the first word line. In another embodiment, the first switch is configured to couple the first word line to the second terminal of the comparator for at least a second predetermined period of time.

In a specific embodiment of the above memory device, the comparator is configured to compare a voltage associated with the first word line with the reference voltage to determine a word line leakage condition. In an embodiment, the second predetermined period of time is selected to allow a voltage associated with the first word line to be discharged for identifying a word line leakage condition. In another embodiment, the second predetermined period of time is about several to hundreds μsec. In another embodiment, the second predetermined period of time is selected according to the detecting leakage criterion and word line capacitance. In yet another embodiment, the memory device has a PMOS transistor coupled between the switch and the first word line. In another embodiment, the first memory array also includes a second word line adjacent the first word line and being coupled to a ground potential during a leakage testing of the first word line. In another embodiment, the memory device also includes a second memory array having a third word line and a second switch selectively coupling the third word line to the power source or the second terminal of the comparator. In an embodiment, the second memory array also has a fourth word line adjacent the third word line and being coupled to a ground potential during a leakage testing of the third word line.

In an alternative embodiment of the invention, a memory device includes a first memory array having a first word line and a second word line, a comparator circuit having a first input terminal and a second input terminal, a reference voltage coupled to the first input terminal of the comparator, and a switch for selectively coupling the first word line to a power source or the second terminal of the comparator. In an embodiment, the switch is configured to couple the first word line to the power source for a first predetermined period of time to allow charging of the first word line. In another embodiment, the switch is configured to couple the first word line to the second terminal of the comparator for at least a second predetermined period of time to allow the first word line to discharge while the second word line is coupled to a ground potential. In another embodiment, the comparator is configured to compare a voltage associated with the first word line with the reference voltage to determine a word line leakage condition.

In yet another embodiment of the present invention, a memory device includes a first memory array having a first word line and a second word line, a second memory array having a third word line and a fourth word line, a comparator circuit having a first input terminal and a second input terminal, and a reference voltage coupled to the first input terminal of the comparator. The memory device also has a first switch for selectively coupling the first word line to a power source or the second terminal of the comparator, and a second switch for selectively coupling the third word line to the power source or the second terminal of the comparator.

In a specific embodiment of the above memory device, the first switch and the second are configured to couple the first word line and the third word line, respectively, to the power source for a first predetermined period of time to allow charging of the first word line and the second word line. In another embodiment, the first switch and the second switch are configured to couple the first word line and the third word line, respectively, to the second terminal of the comparator for at least a second predetermined period of time. In another embodiment, the comparator is configured to compare a voltage associated with the first word line or the third word line with the reference voltage to determine a word line leakage condition.

According to another embodiment of the present invention, a method for detecting word line leakage in a memory device includes coupling a first word line in the memory device to a voltage source while coupling a second word line in the memory device to a ground level voltage. Next, the first word line is decoupled from the voltage source. The method also includes comparing a current of the first word line with a predetermined reference current for determining a leakage condition of the word line.

In a specific embodiment of the above method, the first word line is adjacent to the second word line. In another embodiment, the method also includes a step of waiting for a first time period after coupling the first word line to the voltage source, and a step of waiting for a second time period after decoupling the first word line to the voltage source. In an embodiment, the second time period is about 10 to 200 μsec or greater according to the detecting leakage criterion and word line capacitance. In yet another embodiment, the method includes coupling a plurality of first word lines and a plurality of second word lines to the voltage source and ground level voltage, respectively. In still another embodiment, the plurality of first word line are even-numbered word lines in the memory device, and the plurality of second word lines are odd-numbered word lines in the memory device. In another embodiment, the method also includes a sensing step to perform a memory read operation to determine a current associated with a bit line coupled to the first word line. In some embodiments, the second time period is selected to allow a voltage associated with the first word lines to be discharged for identifying the word line leakage condition. In an embodiment, the predetermined reference current is higher than an intrinsic leakage current associated with the first plurality of word lines. In a specific embodiment, the predetermined reference current is about 10 μA base on sense amplifier operation range.

According to yet another embodiment of the present invention, a method of detecting a word line leakage in a memory device includes charging a first word line in the memory device and discharging a second word line in the memory device. The method also includes comparing a current in the first word line with a predetermined reference current.

According to still another embodiment of the present invention, a memory device includes means for charging a first word line in the memory device, means for discharging a second word line in the memory device, and means for comparing a current in the first word line with a predetermined reference current.

Many benefits are achieved by way of the present invention over conventional techniques. For example, the present technique provides an easy to use method that relies upon conventional technology. Embodiments of the invention provide methods for detecting memory word line leakage conditions which may be difficult to detect using conventional techniques. In some embodiments, the method provides techniques to detecting word line leakage conditions by comparing a memory read current with a predetermined reference current. In certain embodiments, the invention provides techniques for testing leakage conditions associated with a group of word lines or a single word line. In other embodiments, the invention provides methods for testing word line leakage conditions by monitoring word line voltage levels. Various embodiments of the invention provide techniques that allow detection of low level leakage conditions. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed generally to integrated circuits. More particularly, the invention provides a method and apparatus for leakage current testing for integrated circuit memory devices. Merely by way of example, the invention provides techniques for monitoring cell current in a memory device for detecting word line leakage cause by process defects. But it would be recognized that the invention has a much broader range of applicability. For example, the present invention can be applied for testing other leakage conditions in integrated circuit memory devices.

Figure 1:
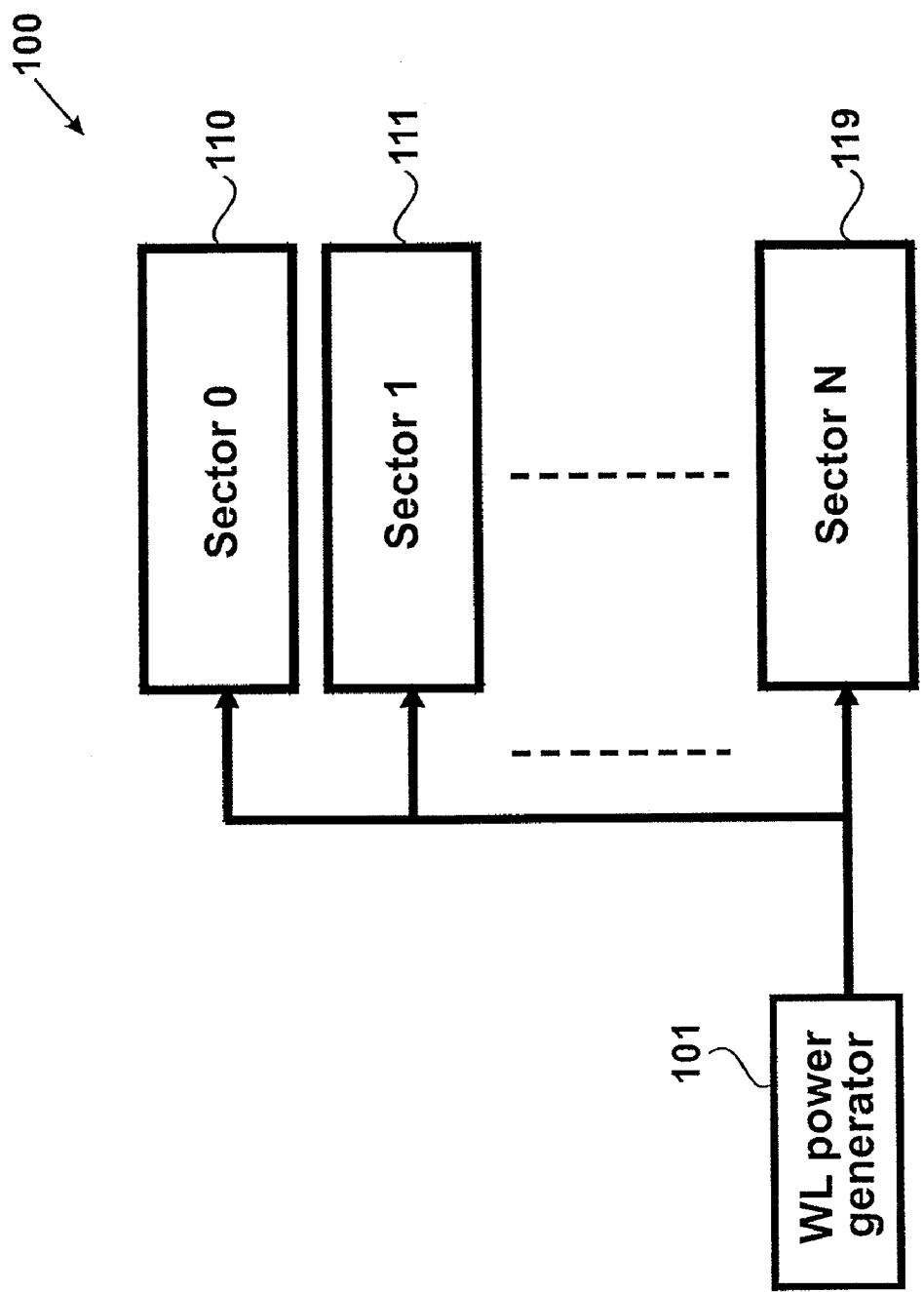
FIG. 1 is block diagram illustrating a conventional memory device.

As discussed above with reference to memory device 100 in FIG. 1, conventional memory leakage conditions are often determined by monitoring power consumption of the device. However, according to embodiments of the present invention, a memory device often has intrinsic leakage conditions caused by, for example, inherent junction leakage current. A certain amount of leakage current is often accepted, for example, as standby leakage current. In contrast, leakage conditions caused by defects need to be identified, but the leakage path may include a high impedance. Under such a condition, the leakage current caused by defects may be comparable in magnitude to the intrinsic leakage current. As a result conventional techniques may not distinguish between intrinsic leakage condition and leakage conditions caused by defects. Therefore, an improved technique for memory word line leakage testing is desired.

Figure 2:
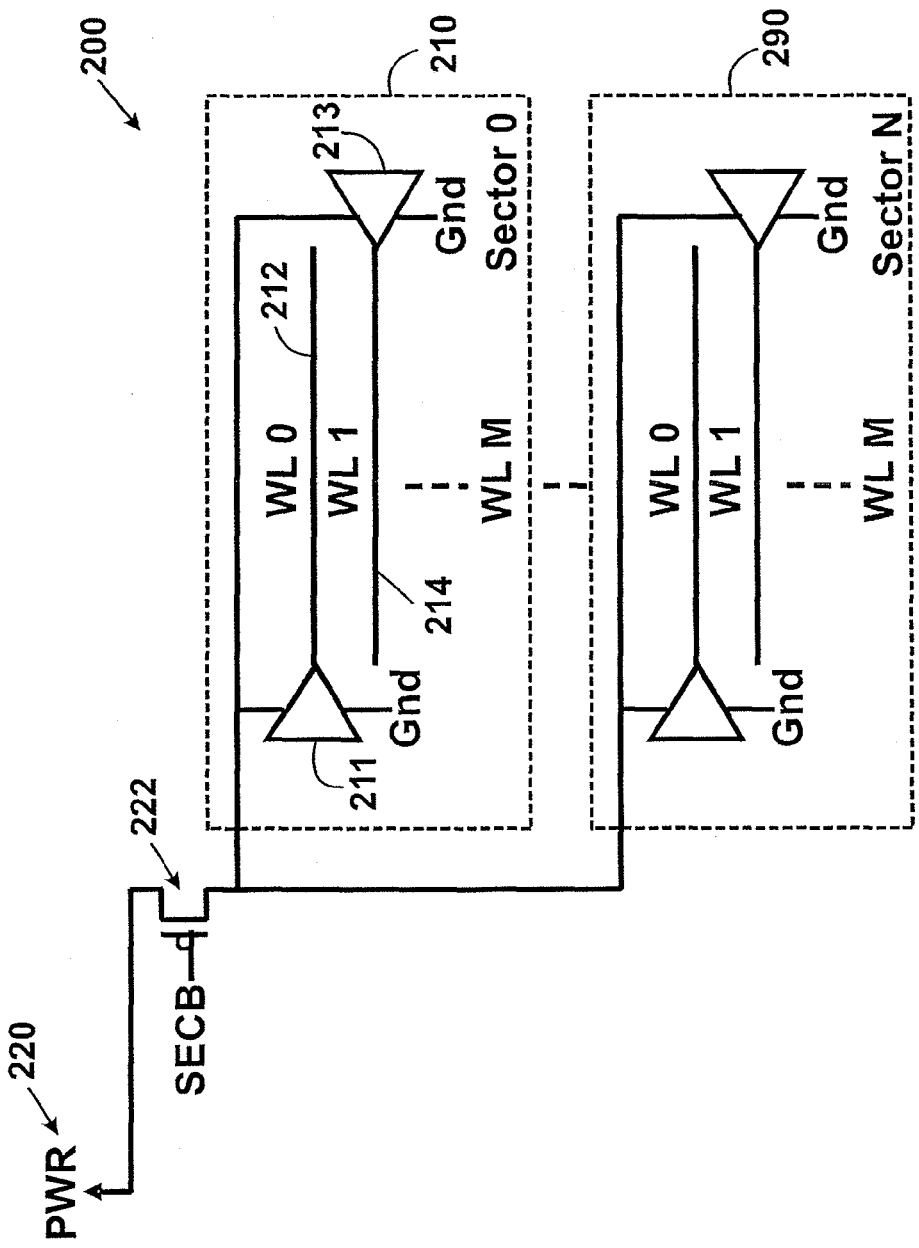
FIG. 2 is a simplified schematic diagram of a memory device according to an embodiment of the present invention.
Figure 3:
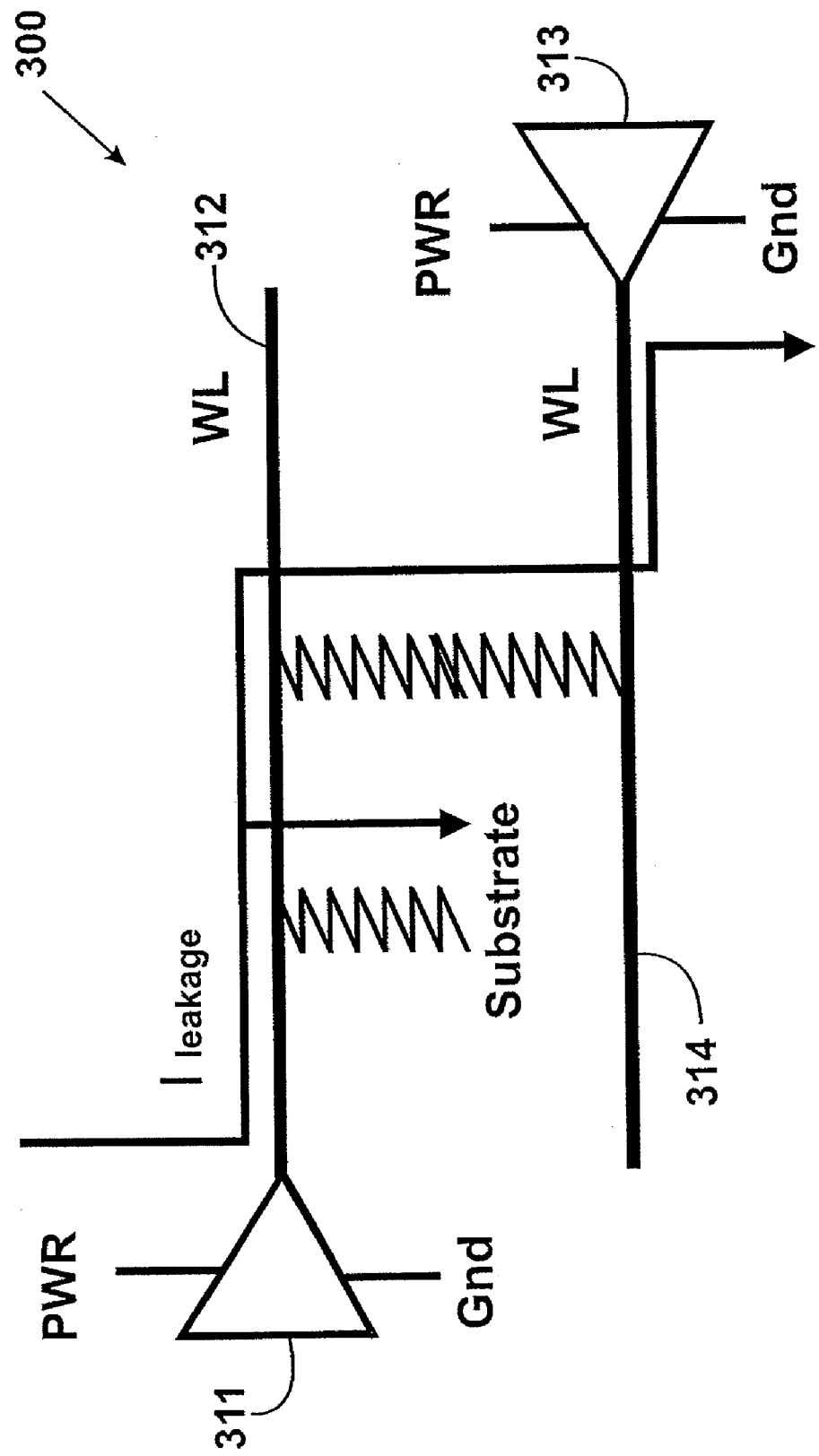
FIG. 3 is a simplified schematic diagram illustrating leakage conditions in a memory device according to an embodiment of the present invention.

FIGS. 2 and 3 are simplified diagrams illustrating word line leakage conditions in a memory device according to an embodiment of the present invention. These diagrams are merely examples, which should not unduly limit the scope of the claims herein. One of ordinary skill in the art would recognize other variations, modifications, and alternatives. FIG. 2 is a simplified schematic diagram illustrating a memory device 200 according to an embodiment of the present invention. As shown, memory device 200 includes one or more memory arrays, such as memory sectors 0-N, designated as 210, ..., 290, etc. As an example, sector 210 includes word line driver 211 coupled to word line 212 and word line driver 213 coupled to word line 214. An array selection switch device 222, e.g., an MOSFET, is coupled to sectors 0-N. In FIG. 2, switch device 222 connects sectors 0-N to a voltage source 220 in response to control signal SECB.

FIG. 3 is a simplified schematic diagram illustrating leakage conditions in a memory device according to an embodiment of the present invention. As shown, word line driver 311 is coupled to word line 312, and word line driver 313 is coupled to word line 314. Two leakage paths associated with word line 312 are shown in FIG. 3. A leakage path is shown to exist between word line 312 and substrate, and another leakage path exists between word line 312 and the adjacent word line 314. Conventional techniques for detecting leakage conditions involve monitoring leakage current from supply voltage to ground using a tester. However; under certain conditions, the leakage current may not be much larger than word line driver intrinsic leakage such as junction leakage. For example, if a high impedance path exists between word lines, the leakage current would be comparable with word line junction leakage. Then it would be difficult for conventional testing methods to determine whether a word line leakage condition exists. Therefore, it is seen that improved techniques for detecting memory device leakage conditions are desired.

Figure 4:
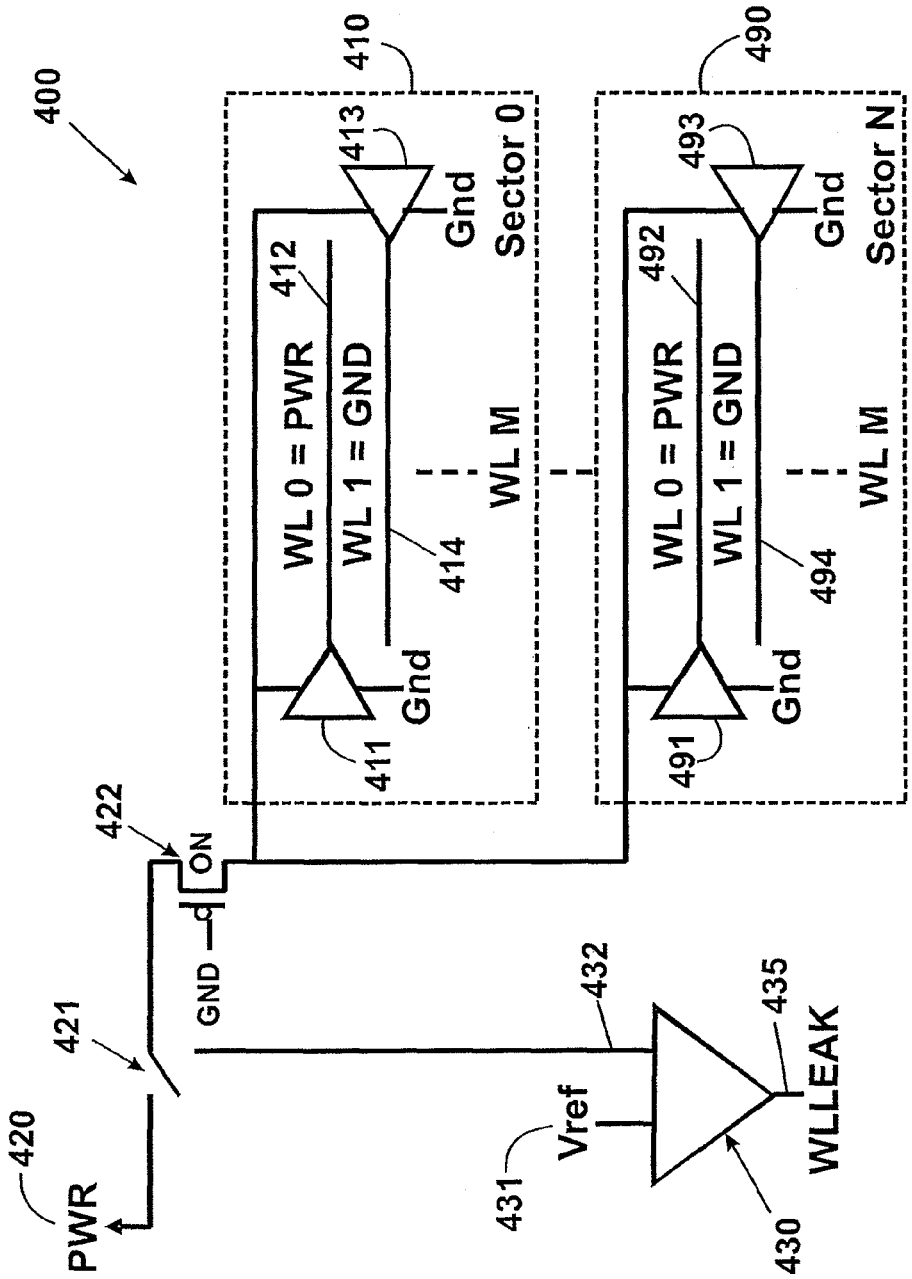
FIG. 4 is a simplified schematic diagram of a memory device for leakage testing according to an embodiment of the present invention.

FIG. 4 is a simplified schematic diagram of a memory device for leakage testing according to an embodiment of the present invention. This diagram is merely an example, which should not unduly limit the scope of the claims herein. One of ordinary skill in the art would recognize other variations, modifications, and alternatives. As shown, memory device 400 includes memory sectors 0-N, designated as 410, ..., 490, etc. As an example, sector 410 includes word line driver 411 coupled to word line 412, and word line driver 413 coupled to word line 414. An array selection switch device 422, e.g., an MOSFET, is coupled to sectors 0-N. In a specific embodiment, array selection switch device 422 is a PMOS device with its gate terminal connected to a ground voltage level (GND). Memory device 400 also includes a power source 420, a comparison circuit 430, and a test switch device 421 which connects the memory sectors to either the power source 420 or an input of the comparison circuit 430, depending on a control signal (not shown). In an embodiment, the invention provides a method for testing memory device 400. The method includes using switch device 421 to connect the memory array, including sectors 0-N, to power source 420 for a predetermined length of time to allow selected word lines in the memory array to charge up to a voltage level PWR, for example, a read voltage level. Under a specific testing condition, adjacent word lines are biased to power source voltage level (PWR) and ground level (GND), respectively. For example, in FIG. 4, word line 412 is connected to PWR, word line 414 is connected to GND. Then test switch device 421 connects the memory array to input 432 of the comparison circuit 430. After a certain period of time to allow the word line voltages to discharge, the word line voltage level at input 432 is compared to a reference voltage level Vref. Accordingly leakage condition can be determined. More details of the method are discussed further below.

Figure 5:
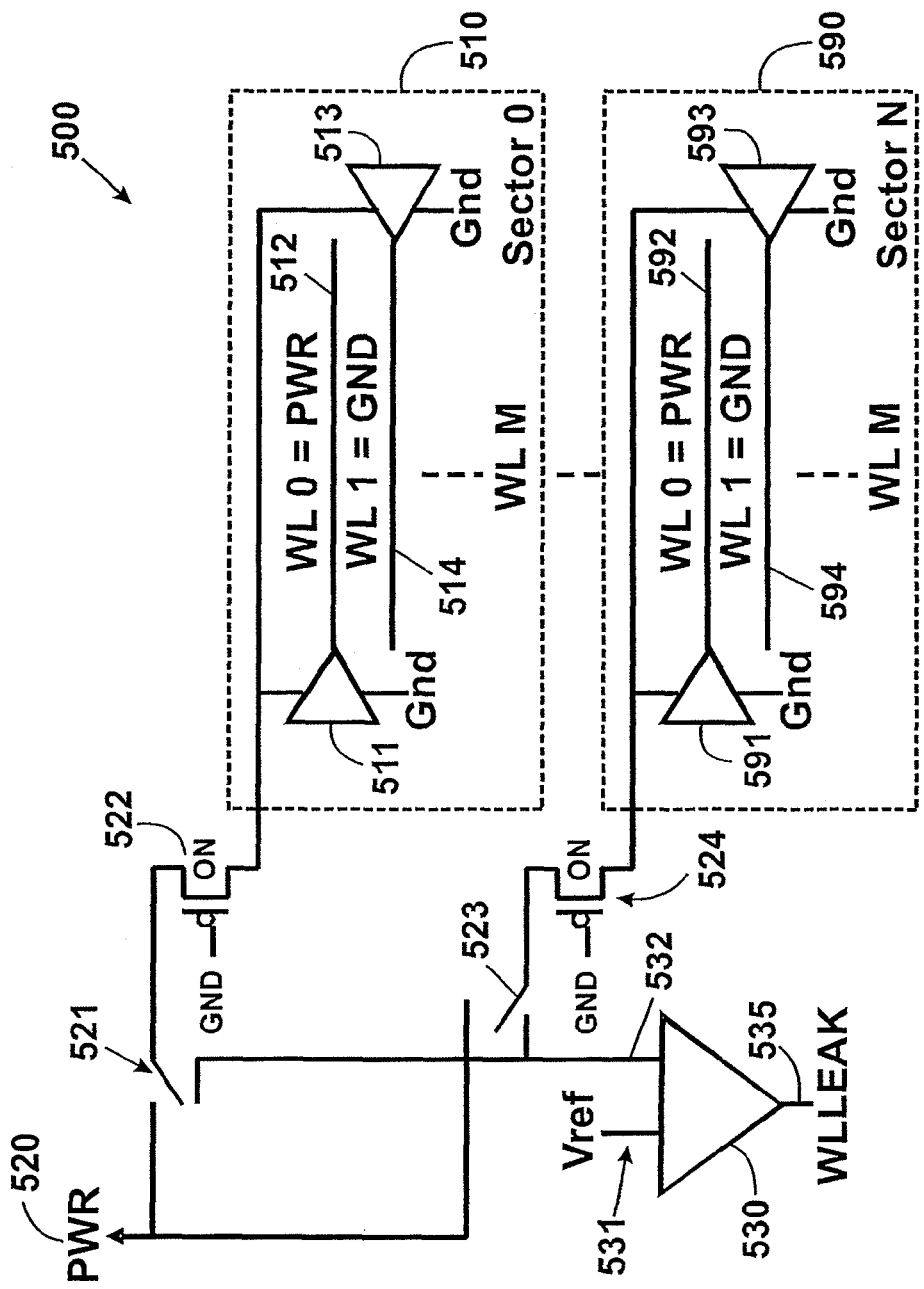
FIG. 5 is a simplified schematic diagram of a memory device for leakage testing according to another embodiment of the present invention.

FIG. 5 is a simplified schematic diagram of a memory device for leakage testing according to another embodiment of the present invention. This diagram is merely an example, which should not unduly limit the scope of the claims herein. One of ordinary skill in the art would recognize other variations, modifications, and alternatives. As seen, memory device 500 is similar to memory device 400. In FIG. 5, memory device 500 includes an array switch device and a test switch device for each of the memory sectors. For example, array switch device 522 and test switch device 521 are associated with sector 0, designated as 510. As another example, array switch device 524 and test switch device 523 are associated with sector N, designated as 590. The test switches connect the respective memory sectors to either power source 520 or input 532 of the comparison circuit 530. In an embodiment of the invention, a method is provided for testing memory circuit 500. Similar to the method discussed above in connection with FIG. 4, the memory arrays are charged to a read voltage level and then allowed to discharge, and then be compared to a reference voltage level. Since each memory sector is provided with an array selection switch device and a test switch device, each sector can be tested separately in an embodiment. In another embodiment, a group of sectors can be tested simultaneously.

Figure 6:
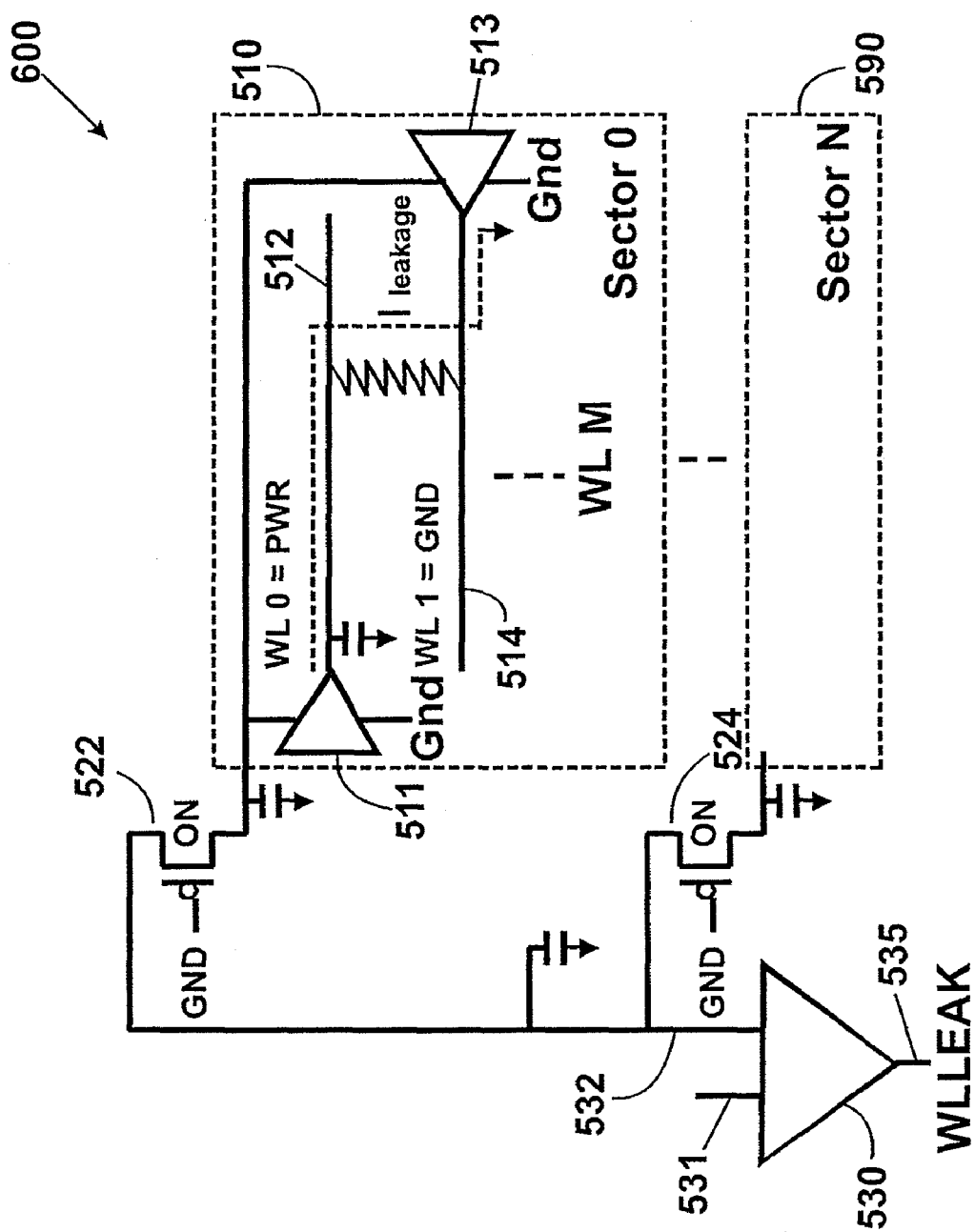
FIG. 6 is a simplified schematic diagram illustrating a method for word line leakage testing in a memory device according to an embodiment of the present invention.

FIG. 6 is a simplified schematic diagram illustrating a method for word line leakage testing in a memory device according to an embodiment of the present invention. In FIG. 6, memory sectors 510, ..., 590, have been charged to a certain read voltage level, and are connected to input 532 of comparison circuit 530. The voltage level at input 532 is compared to a reference voltage level at 531. A method for determining leakage condition is discussed below in reference to FIGS. 7 and 8.

Figure 7:
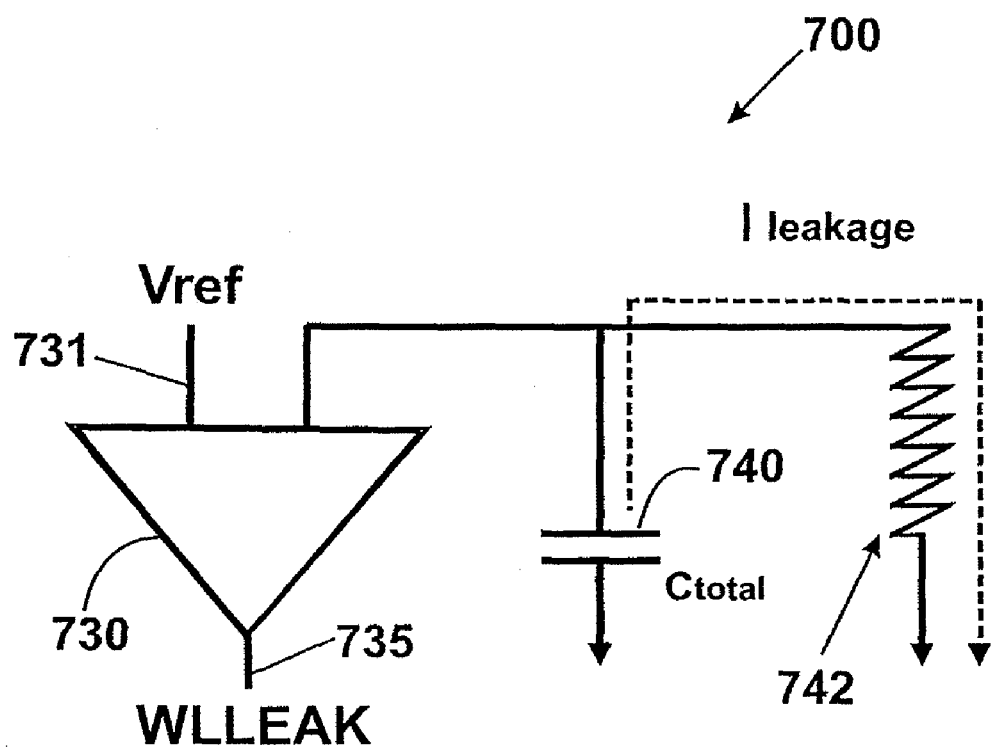
FIG. 7 is a simplified schematic diagram illustrating the methods for word line leakage testing in FIGS. 5 and 6.
Figure 8:
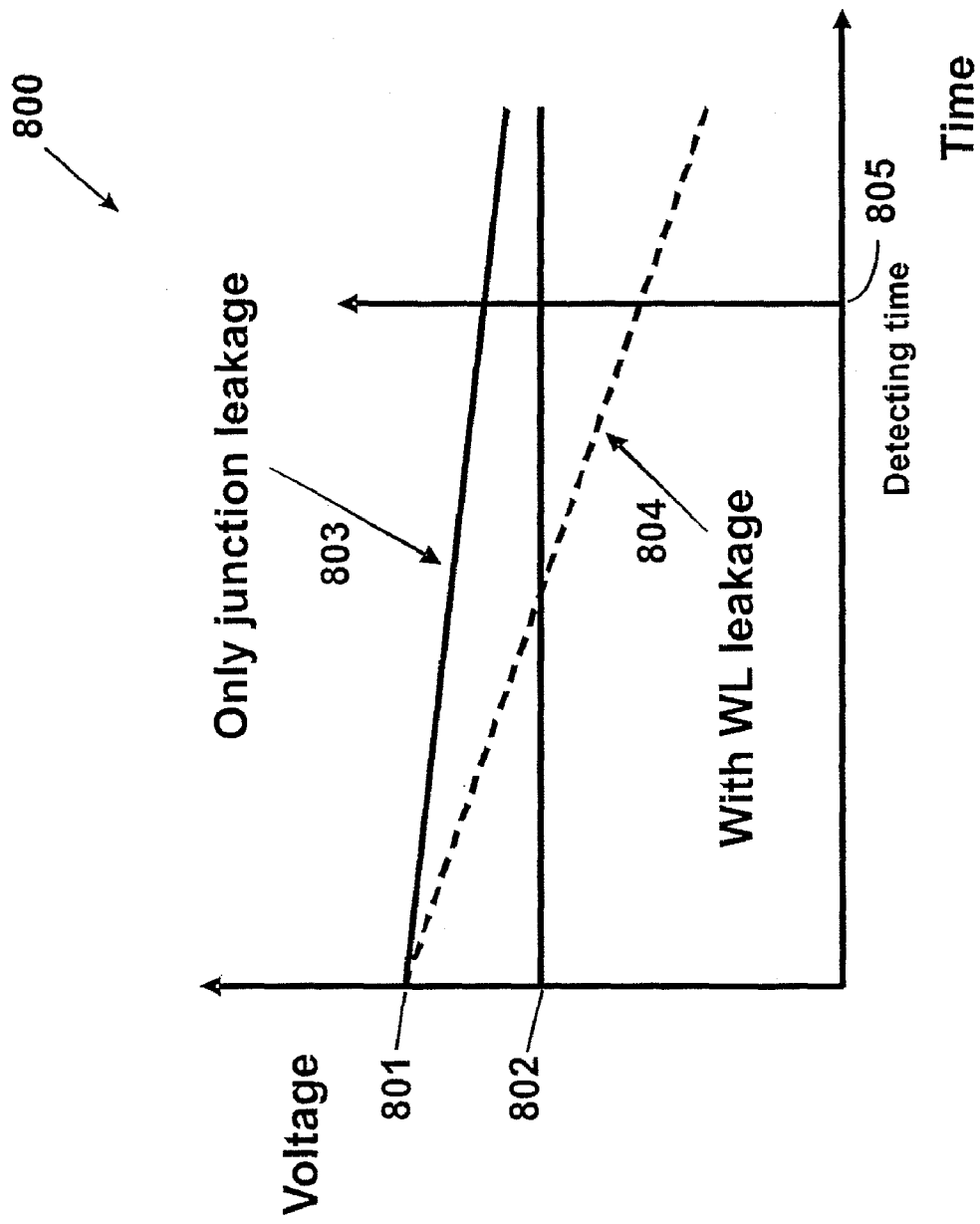
FIG. 8 is another simplified diagram illustrating the methods for word line leakage testing in FIGS. 5 and 6.

FIG. 7 is a simplified schematic diagram illustrating the methods for word line leakage testing in FIGS. 5 and 6. As shown, capacitance 740 ($C_{total}$) represent the total capacitance associated with the word lines under testing. In FIG. 7, the word lines have been charged to a predetermined voltage level and now are allowed to discharge. The dotted line marked with $I_{leakage}$ represents a potential leakage current path. FIG. 8 is a simplified diagram illustrating the methods for word line leakage testing in FIGS. 5 and 6. In FIG. 8, the voltage level is plotted against time as the voltage is discharged. For example, line 803 represents the voltage discharging with time for a memory array having intrinsic junction leakage. Dotted line 804 represents the voltage discharging with time for a memory array having word line leakage condition in addition to intrinsic junction leakage. Initially, both 803 and 804 are at voltage 801. After a predetermined time 805, marked as "Detection time" in FIG. 8, dotted line 804 drops below line 803, indicating the word line leakage condition. This leakage condition can be identified by comparing the word line voltage level with a reference voltage level 802 at time 805. In embodiments of the invention, the reference voltage level 802 and detection time can be selected to monitor leakage conditions.

Figure 9:
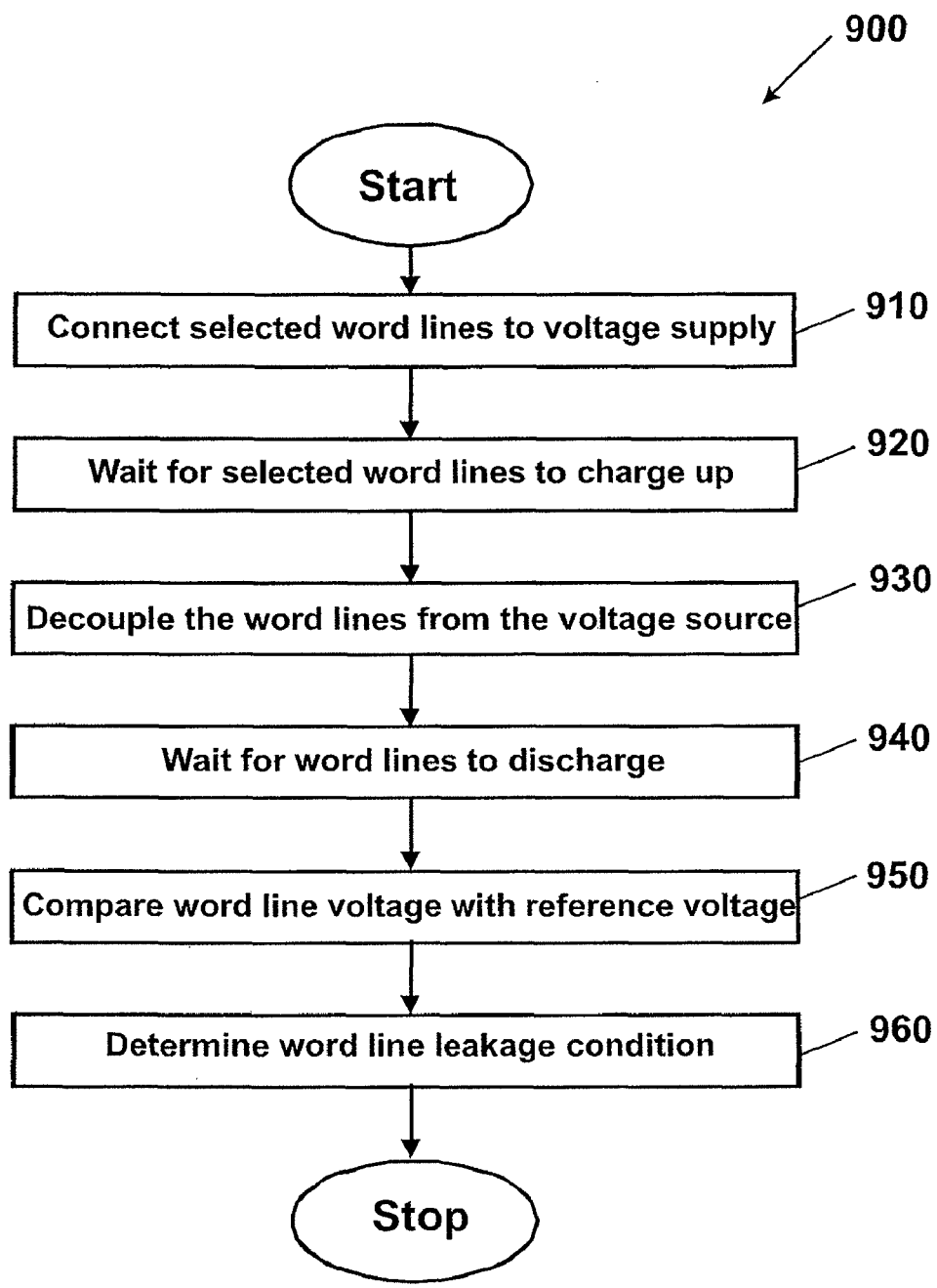
FIG. 9 is a simplified flow diagram of a method for word line testing in a memory device according to an embodiment of the present invention.

FIG. 9 is a simplified flow diagram 900 of a method for detecting word line leakage in a memory device according to an embodiment of the present invention. This diagram is merely an example, which should not unduly limit the scope of the claims herein. One of ordinary skill in the art would recognize other variations, modifications, and alternatives. With reference to FIG. 9, the method can be briefly outlined below.

1. (Process 910) Couple word line to voltage source;
2. (Process 920) Wait for word line to reach read voltage level;
3. (Process 930) Decouple word line from voltage source;
4. (Process 940) Wait for word line to discharge;
5. (Process 950) Compare word line voltage with reference voltage; and
6. (Process 960) Determine word line leakage condition.

The method 900 shown in FIG. 9 is now discussed with reference to FIGS. 4-8. In Process 910, the method includes coupling one or more word lines in the memory device to a voltage source. Depending on the embodiments, the word lines can be selected in different ways. For example, in the memory device 400 shown in FIG. 4, a word line from each memory sectors is chosen. That is, word line 412 in sector 0, ..., through word line 492 in sector N are connected to voltage source 420 using switch device 421. In another example, memory device 500 shown in FIG. 5, one word line from one of the sectors is selected for leakage current testing. That is, word line 512 in sector 0 may be connected to voltage source 520 using switch device 521 in for testing in one example. Then word line 592 in sector N may be selected for testing subsequently. In yet another example, shown in FIG. 6, more than one word line may be selected for testing simultaneously. The selected word lines are coupled to voltage source PWR which is designated as 420 in FIG. 4 and 520 in FIG. 5. According to embodiments of the invention, the method includes grounding certain word lines adjacent to the selected word lines for effective testing of inter-word lines leakage conditions. In Process 920, the process includes waiting for a first predetermined period of time to allow the one or more word lines to reach a predetermined read voltage level. For example, the predetermined voltage level may be a read voltage level for a memory read operation. Of course, another suitable voltage levels can also be used. In Process 930, the word lines are decoupled from the voltage source. Then the word lines are allowed to discharge during a second predetermined period of wait time in Process 940. Afterwards, in Process 950, the method includes comparing a voltage associated with the word lines with a reference voltage which has been selected for identifying a word line leakage condition associated with the selected word lines. The comparison can be carried out using a comparator circuit, for example 430 in FIG. 4 or 530 in FIG. 5. In this case, reference voltage 802 in FIG. 8 can be used to identify the leakage condition. In Process 960, the method can be used to determine whether the word line leakage condition exists. As shown in FIG. 8, after a wait period 805, discharge curve 804 indicates that the leakage associated with the word line or word lines under test is higher than a reference word line 803.

In the method described above, various testing parameters can be selected for different testing conditions. For example, the first and second predetermined periods of time for charging up the word lines under testing, as well reference voltage and current levels may be determined experimentally. In a particular example, the second predetermined period of time is about several to hundreds μsec according to the detecting leakage criterion and word line capacitance. In an embodiment, the predetermined reference current is selected to be higher than intrinsic leakage current associated with the first plurality of word lines as well as proper working range applies to the sense amplifier. In another specific embodiment, the predetermined reference current is about 10 μA. Of course, there can be other variations, modifications, and alternatives.

The above sequence of processes provides word line leakage detection method according to an embodiment of the present invention. As shown, the method uses a combination of steps including a way of charging up selected word lines, waiting for the word lines to discharge, and then observing the word line voltage to determine a leakage condition. Other alternatives can also be provided where steps are added, one or more steps are removed, or one or more steps are provided in a different sequence without departing from the scope of the claims herein. Further details of the present method can be found throughout the present specification and more particularly below.

Figure 10:
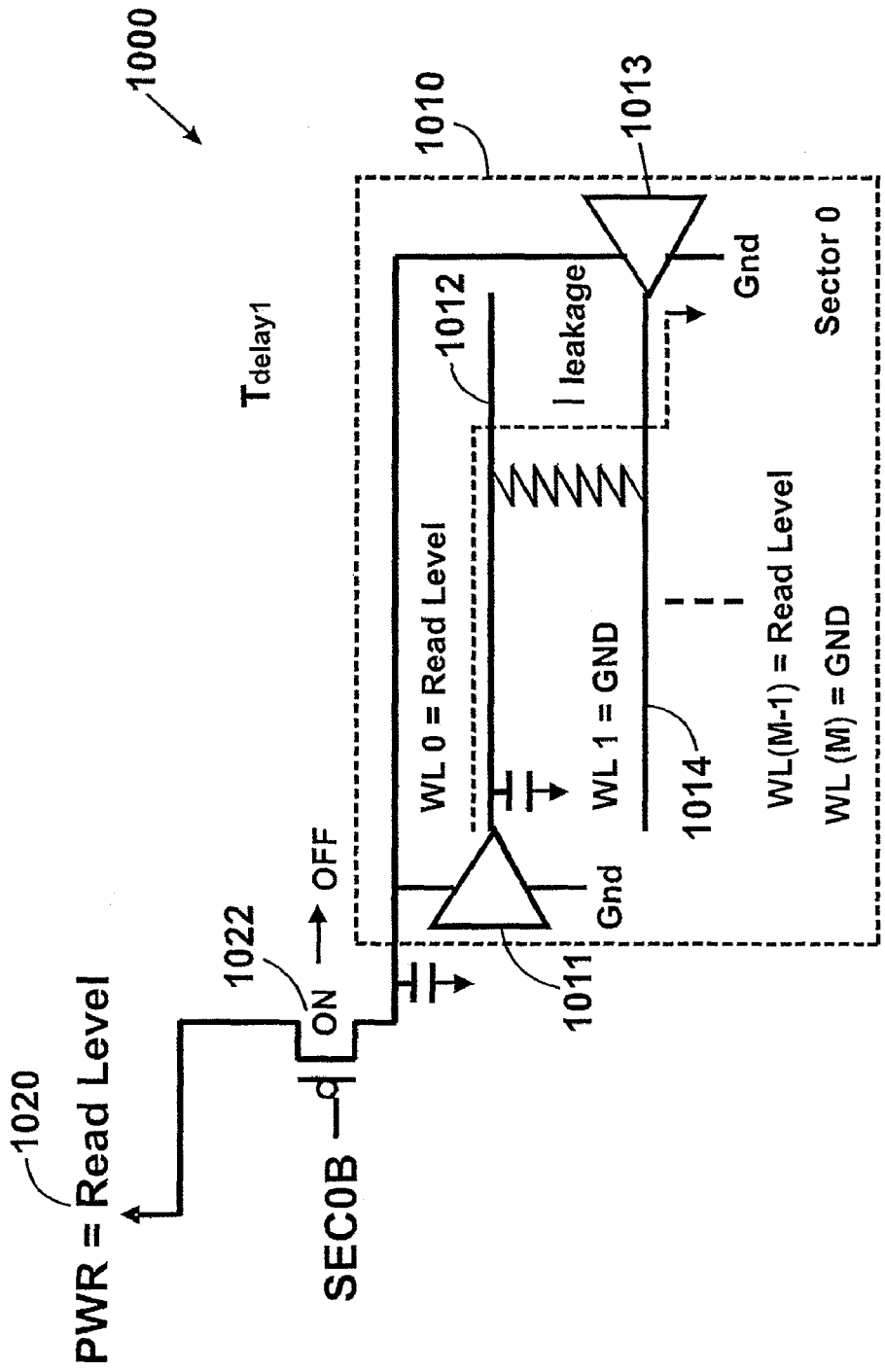
FIG. 10 is schematic diagram of a memory device for leakage testing according to an alternative embodiment of the present invention.

FIG. 10 is schematic diagram of a memory device for leakage testing according to an alternative embodiment of the present invention. This diagram is merely an example, which should not unduly limit the scope of the claims herein. One of ordinary skill in the art would recognize other variations, modifications, and alternatives. As shown, memory device 1000 includes one or more memory arrays, for example, memory sector 0, designated as 1010 in FIG. 10. Memory sector 1010 includes a plurality of word lines, each of which coupled to a word line driver device. For example, word line driver 1011 is coupled to word line 1012, and word line driver 1013 is coupled to word line 1014. An array selection switch device 1022, e.g., an MOSFET, is coupled to sector 1010 and a power source 1020. Array selection switch device 1022 connects sector 1010 to power source 1020 in response to a control signal, designated as SEC0B in FIG. 10. In alternative embodiments, memory device may include multiple arrays arranged in sectors. In an embodiment, a sector may be connected to a specific array selection switch device. In other embodiments, two or more arrays may be connected to an array selection switch.

Figure 11:
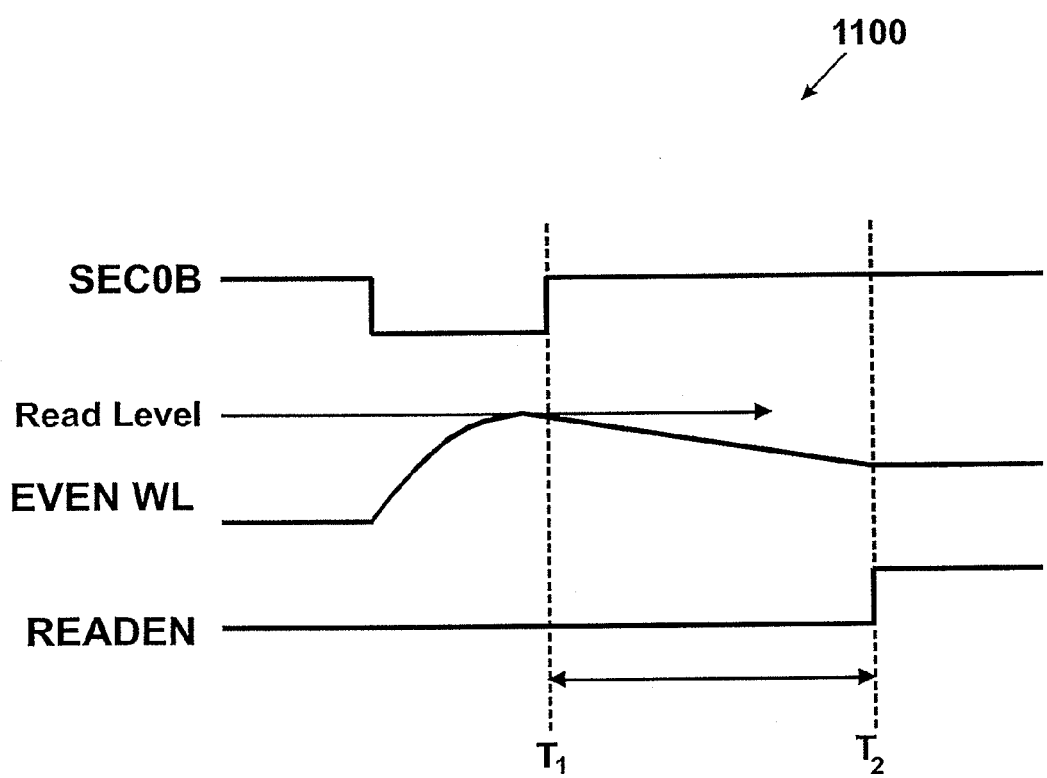
FIG. 11 is a simplified timing diagram illustrating a method for word line leakage testing associated with the memory device 1000 in FIG. 10.

FIG. 11 is a simplified timing diagram illustrating a method for word line leakage testing according to an alternative embodiment of the present invention. This diagram is merely an example, which should not unduly limit the scope of the claims herein. One of ordinary skill in the art would recognize other variations, modifications, and alternatives. The method is discussed below with reference to the memory device 1000 in FIG. 10. The method includes activating control signal SEC0B to connect the memory array 1010 to power source 1020 for a predetermined length of time to allow selected word lines in the memory array to charge up to a voltage level PWR, for example, a read voltage level. Under a specific testing condition, adjacent word lines are biased to power source voltage level (PWR) and ground level (GND), respectively. For example, in FIG. 10, even-numbered word lines such as word line WL 0 (1012) are connected to PWR, whereas odd-numbered word lines such as word line WL 1 (1014) are connected to GND. After the selected word lines are charged up to the predetermined level, control signal SEC0B is deactivated, and the word line voltages to discharge during a period of wait time, as marked between the dotted lines $T_1$ and $T_2$ in the timing diagram in FIG. 11. Then, a memory read operation is started by the READEN control signal. Word line leakage conditions can be determined as discussed below.

Figure 12:
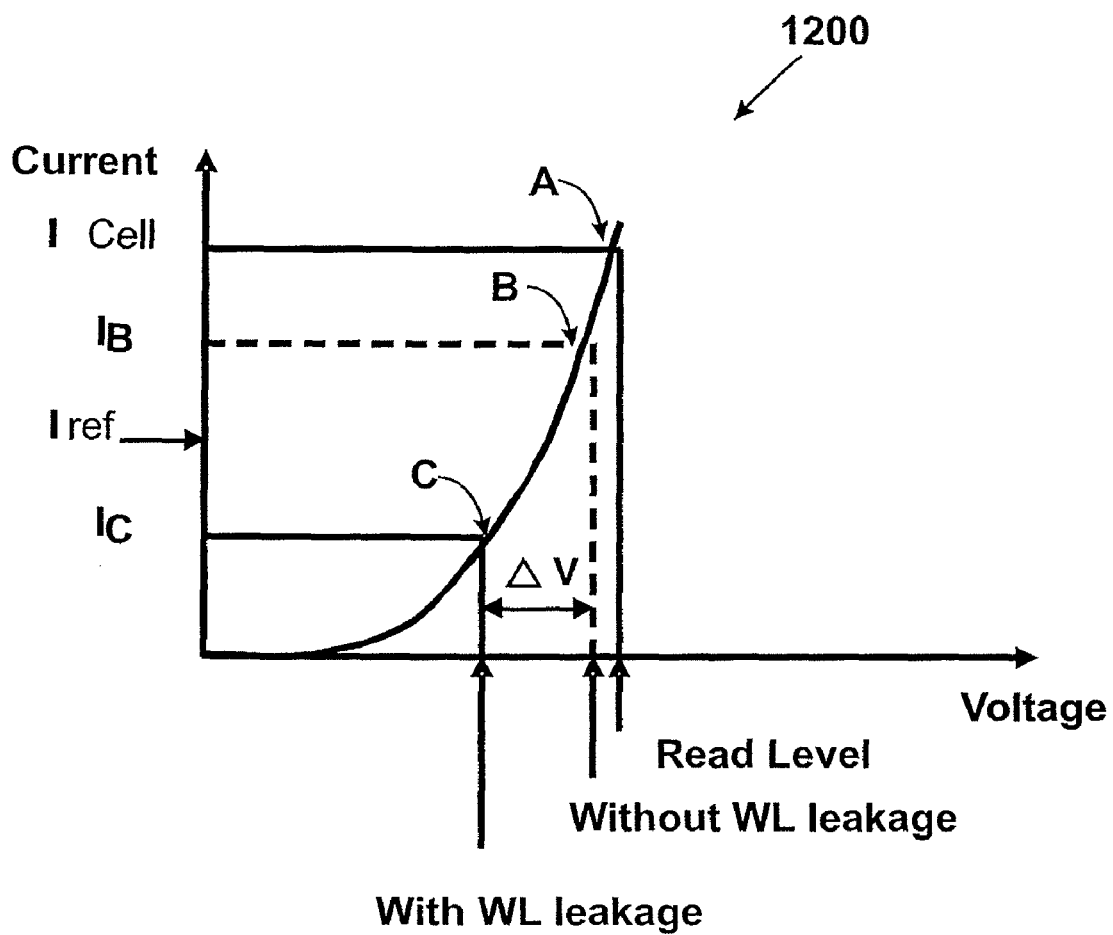
FIG. 12 is a simplified I-V diagram illustrating a method for word line leakage testing associated with the memory device 1000 in FIG. 10.

FIG. 12 is a simplified I-V diagram illustrating a method for word line leakage testing according to an embodiment of the invention. This diagram is merely an example, which should not unduly limit the scope of the claims herein. One of ordinary skill in the art would recognize other variations, modifications, and alternatives. As shown, memory array read current is plotted against word line voltage. Point A represents the read current when the word line voltage is at the full read voltage level. Point B represents the cell current $I_B$ when the word line voltage has dropped slightly due to intrinsic junction leakages, for example. Point C represents the cell current $I_c$ when the word line voltage has dropped more due to additional word line leakage conditions caused by, for example, defects. In an embodiment of the invention, a reference current level $I_{ref}$ is selected to identify word line leakage conditions. In a specific embodiment, a word line leakage condition is identified if the read current is less than $I_{ref}$. Of course, there can be other variations, modifications, and alternatives. More details of the method for testing word line leakage conditions are discussed below with reference to FIGS. 10-13.

Figure 13:
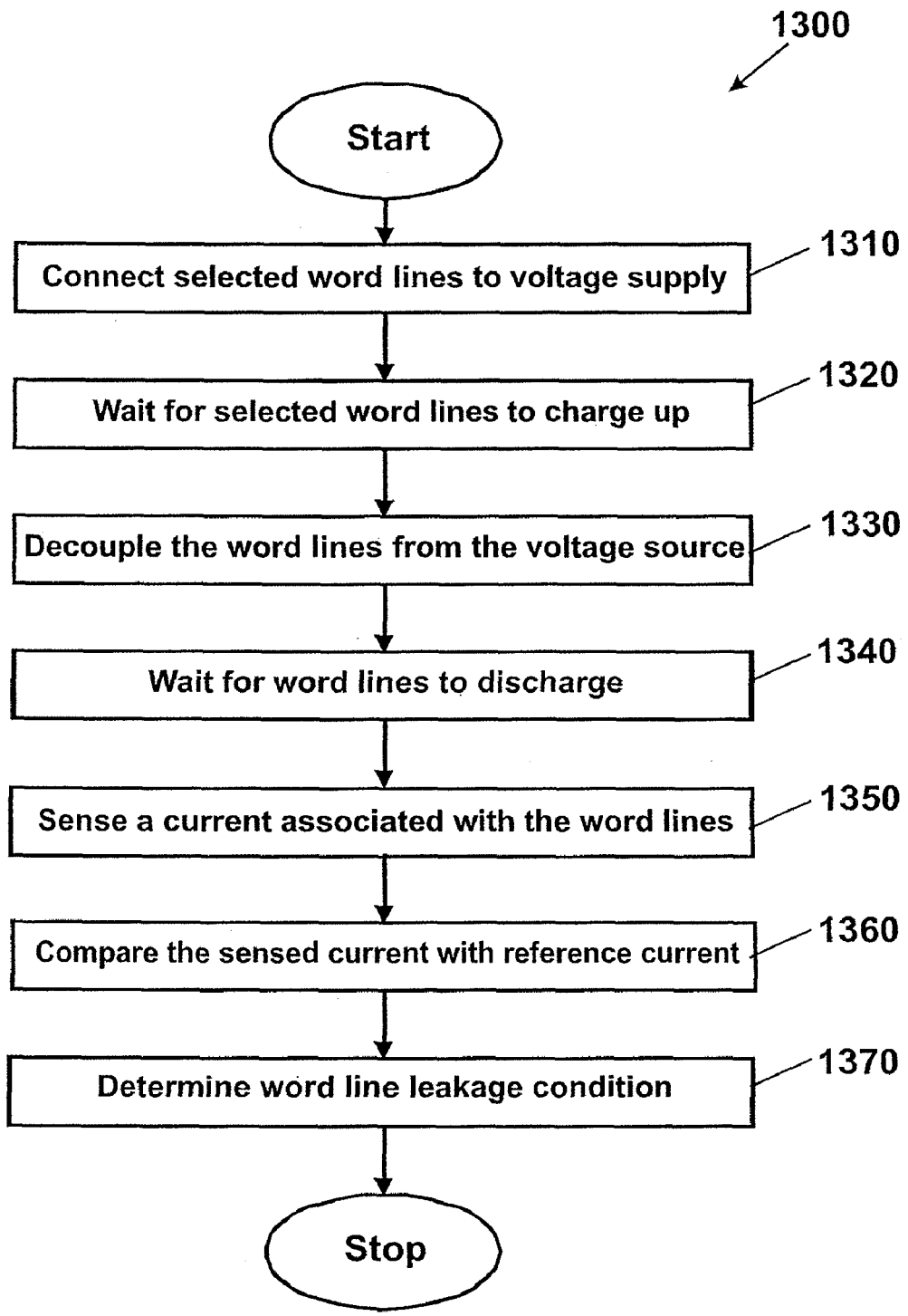
FIG. 13 is simplified flow diagram of a method for word line testing in a memory device associated with the memory device 1000 in FIG. 10 according to an embodiment of the present invention.

FIG. 13 is a simplified flow diagram 1300 of a method for detecting word line leakage in a memory device according to another embodiment of the present invention. This diagram is merely an example, which should not unduly limit the scope of the claims herein. One of ordinary skill in the art would recognize other variations, modifications, and alternatives. With reference to FIG. 13, the method can be briefly outlined below.

1. (Process 1310) Connect selected word lines to voltage supply;
2. (Process 1320) Wait for selected word lines to reach a predetermined read voltage level;
3. (Process 1330) Decouple the word lines from the voltage source;
4. (Process 1340) Wait for word lines to discharge;
5. (Process 1350) Sense a current associated with the word lines;
6. (Process 1360) Compare the sensed current with reference current; and
7. (Process 1370) Determine word line leakage condition.

As shown, in Process 1310, the method includes coupling a first plurality of word lines in the memory device to a voltage source, while coupling a second plurality of word lines in the memory device to a ground level voltage. Each of the second plurality of word lines is adjacent to a corresponding one of the first plurality of word lines. Depending on the embodiments, the word lines can be selected in different ways. For example, in the memory device 1000 shown in FIG. 10, even-numbered word lines from the memory sector are coupled to the voltage source, whereas odd-numbered word lines in the memory sector are coupled to a ground level voltage. In another example, only one word line may be coupled to the voltage source, whereas an adjacent word line is coupled to a ground level voltage. In FIG. 10, the selected word lines are coupled to voltage source PWR 1020. In Process 1320, the process includes waiting for a first predetermined period of time to allow the first plurality of word lines to reach a predetermined read voltage level. For example, the predetermined voltage level may be a read voltage level for a memory read operation, as shown by the "Read Level" voltage associated with EVEN WL in FIG. 11. Of course, another suitable voltage levels can also be used. In Process 1330, the word lines are decoupled from the voltage source. Then the word lines are allowed to discharge during a second predetermined period of wait time in Process 1340, shown as $T_1$ and $T_2$ in FIG. 11. Afterwards, in Process 1350, the method includes sensing a current associated with the selected word lines. In Process 1360, the method includes comparing the sensed current with a predetermined reference current. The predetermined reference current is selected for identifying a word line leakage condition associated with the first plurality of word lines. In Process 1370, the method can be used to determine whether the word line leakage condition exists. For example, in FIG. 12, the reference current is shown as $I_{ref}$ and a sensed current below $I_{ref}$ is identified as a leakage condition.

In the method described above, various testing parameters can be selected for different testing conditions. For example, the first and second predetermined periods of time for charging up the word lines under testing, as well reference voltage and current levels may be determined experimentally. In a particular example, the second predetermined period of time is about several to hundreds μsec according to the detecting leakage criterion and word line capacitance. In an embodiment, the predetermined reference current is selected to be higher than intrinsic leakage current as well as proper working range applies to sense amplifier. In another specific embodiment, the predetermined reference current is about 10 μA. Of course, there can be other variations, modifications, and alternatives.

The above sequence of processes provides word line leakage detection method according to an embodiment of the present invention. As shown, the method uses a combination of steps including a way of charging up selected word lines, waiting for the word lines to discharge, and then sensing a current associated with the word line under test to determine a leakage condition. Other alternatives can also be provided where steps are added, one or more steps are removed, or one or more steps are provided in a different sequence without departing from the scope of the claims herein. Further details of the present method can be found throughout the present specification and more particularly below.

Figure 14:
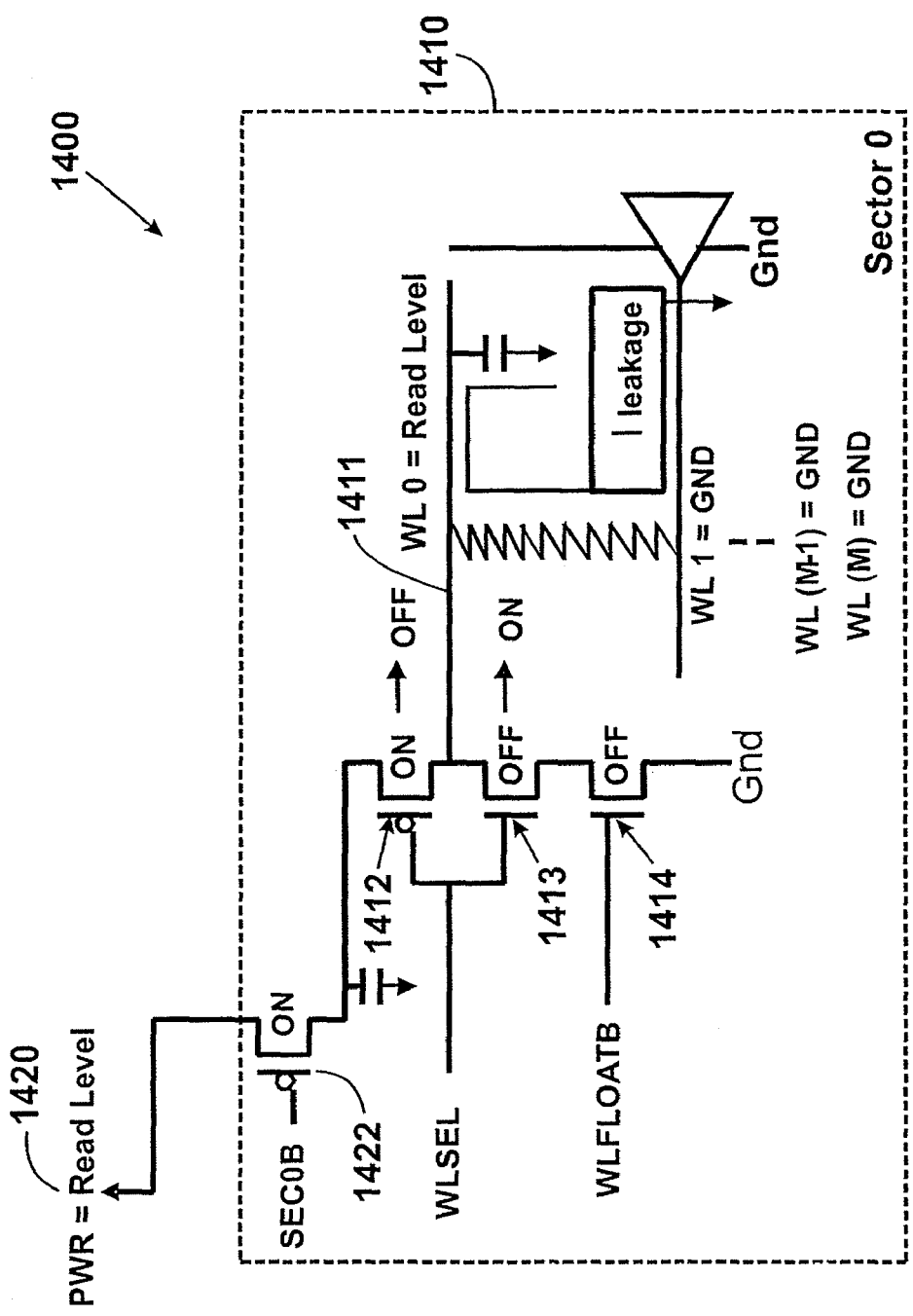
FIG. 14 is schematic diagram of a memory device for leakage testing according to yet another embodiment of the present invention.
Figure 15:
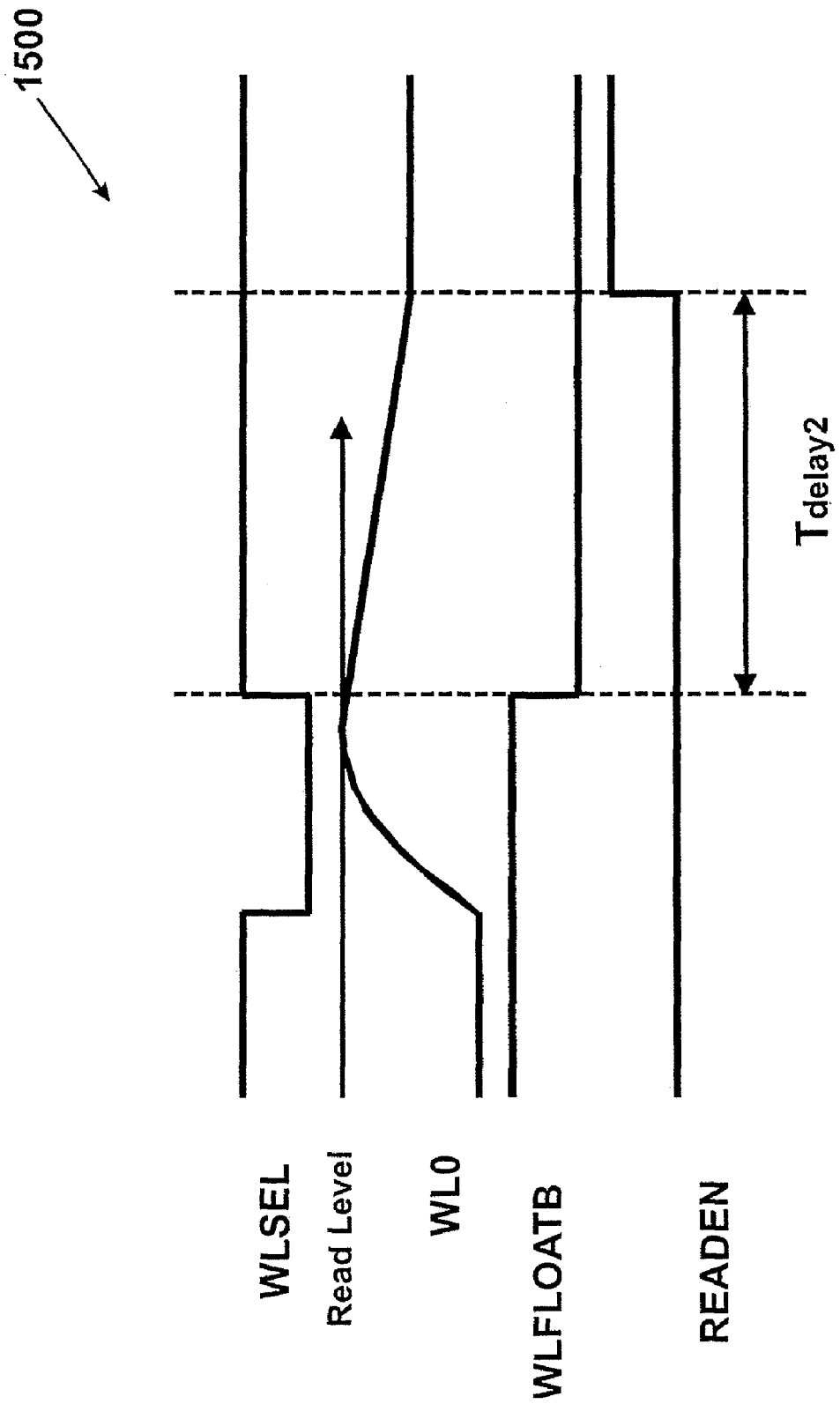
FIG. 15 is a simplified timing diagram illustrating a method for word line leakage testing associated with the memory device 1400 in FIG. 14.
Figure 16:
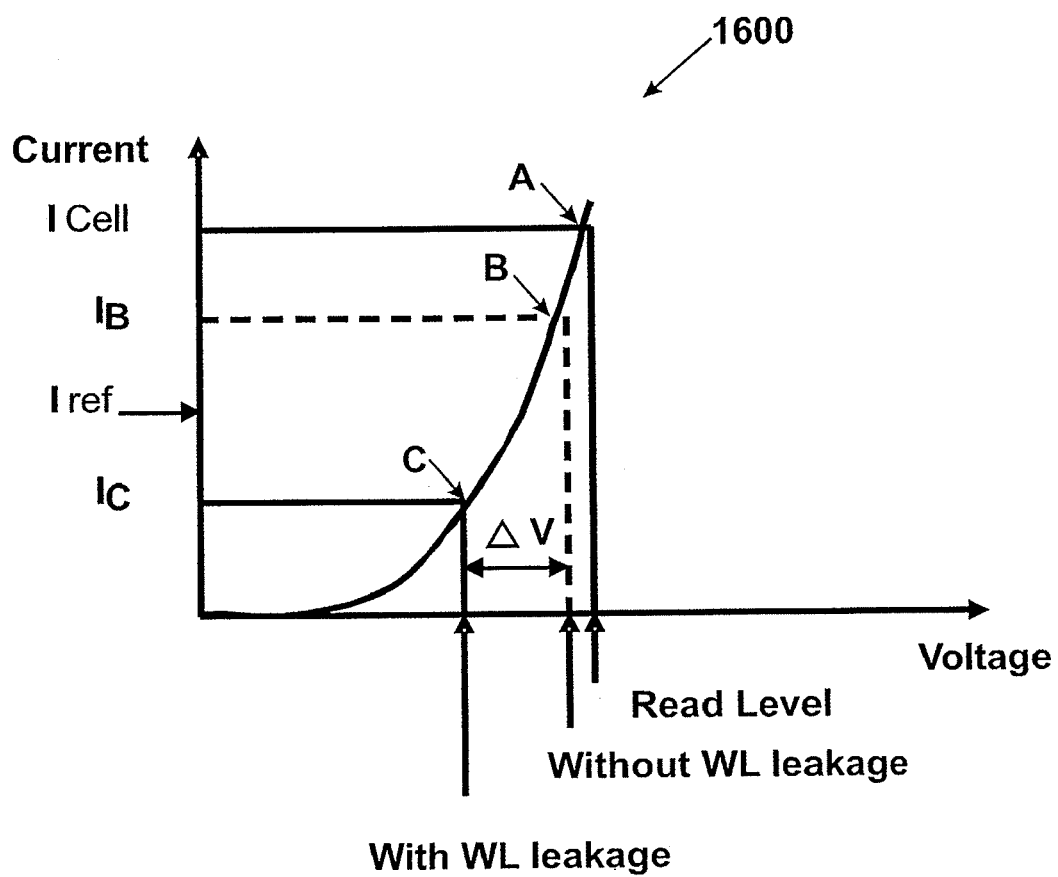
FIG. 16 is a simplified I-V diagram illustrating a method for word line leakage testing associated with the memory device 1400 in FIG. 14.

FIGS. 14-16 are simplified diagrams illustrating a method for testing word line leakage conditions according to another embodiment of the present invention. These diagrams are merely examples, which should not unduly limit the scope of the claims herein. One of ordinary skill in the art would recognize other variations, modifications, and alternatives. FIG. 14 is schematic diagram of a memory device for leakage testing according to an embodiment of the present invention. Memory device 1400 is similar to memory device 1000, but also includes capabilities for testing individual word lines. As shown, memory device 1400 includes one or more memory arrays, for example, memory sector 0, designated as 1410. Memory sector 1410 includes a plurality of word lines, each of which coupled to a word line testing selection device. For example, word line 1411 is coupled to word line testing selection device which includes PMOS transistor 1412 and NMOS transistor 1413 responsive to control signal WLSEL, and NMOS transistor 1414 responsive to control signal WLFLOATB. An array selection switch device 1422, e.g., an MOSFET, is coupled to sector 1410 and a power source 1420. Array selection switch device 1422 connects sector 1010 to power source 1420 in response to a control signal, designated as SEC0B in FIG. 14. According to a specific embodiment, the invention provides a method for testing word line leakage in memory device 1400, as discussed below.

The method includes charging up a selected word line in a memory array, while other word lines in the array are grounded. Then the selected word line is connected to a floating terminal and allowed to discharge. After a predetermined wait time, a memory read operation is carried out to determine a leakage condition. For example, in FIG. 14, WL 0 (1411) is selected for testing by turning on PMOS 1412 and turning off NMOS 1413. WL 0 is connected to the floating terminal by turning off PMOS 1412, turning on NMOS 1413, and turning off NMOS 1414. WL 0 (1411) is then connected to a drain terminal of the turned-of NMOS 1414.

FIG. 15 is a simplified timing diagram and FIG. 16 is a simplified I-V diagram illustrating the method for word line leakage testing associated with the memory device 1400 in FIG. 14. More details of the method for testing word line leakage conditions are discussed below with reference to FIGS. 14-17.

Figure 17:
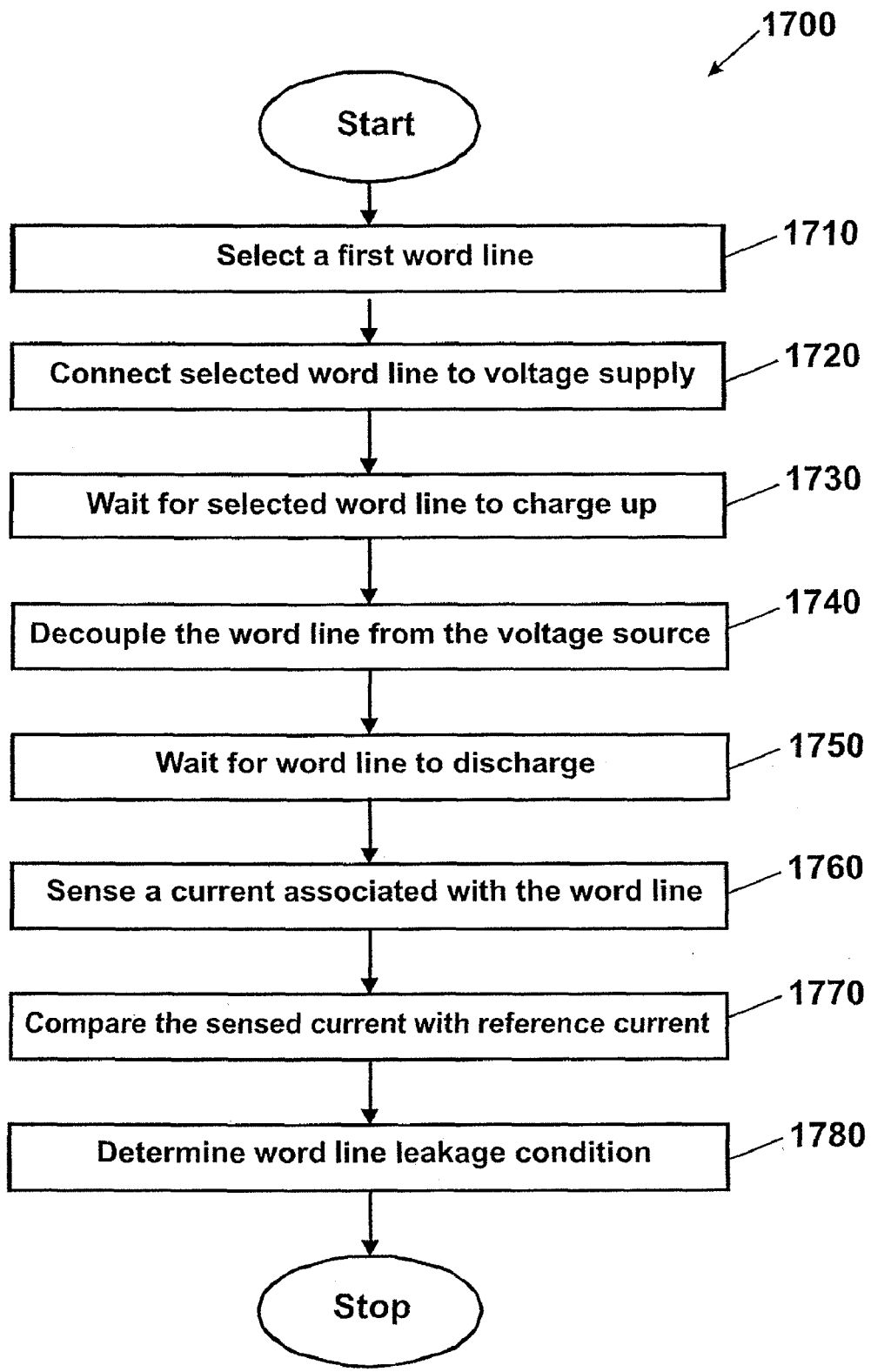
FIG. 17 is simplified flow diagram of a method for word line testing in a memory device associated with the memory device 1400 in FIG. 14 according to an embodiment of the present invention.

FIG. 17 is a simplified flow diagram 1700 of a method for detecting word line leakage in a memory device according to an embodiment of the present invention. This diagram is merely an example, which should not unduly limit the scope of the claims herein. One of ordinary skill in the art would recognize other variations, modifications, and alternatives. With reference to FIG. 17, the method can be briefly outlined below.

1. (Process 1710) Select a first word line from the plurality of word lines in the memory device;
2. (Process 1720) Couple the first word line in the memory device to voltage source while grounding unselected word lines in the memory array;
3. (Process 1730) Wait for a first predetermined period of time to allow the first word line to reach a predetermined read voltage level;
4. (Process 1740) Couple the first word line to a floating voltage terminal;
5. (Process 1750) Wait for a second predetermined period of time to allow the first word line to discharge;
6. (Process 1760) Sense a current associated with the first word line;
7. (Process 1770) Compare the sensed current with a predetermined reference current, the predetermined reference current being selected for identifying a word line leakage condition; and
8. (Process 1780) Determine whether the word line leakage condition exists.

As shown, in Process 1710 the method includes selecting a first word line from the plurality of word lines in the memory device. Referring to FIG. 14 as an example, WL 0 (1411) is selected for testing. In Process 1720, the method coupling the first word line in the memory device to voltage source while grounding unselected word lines in the memory array. Referring to FIG. 14 as an example, WL0 (1411) is selected for testing, and WL 1 to WL (M) are connected to a ground voltage. In Process 1730, the method includes waiting for a first predetermined period of time to allow the first word line to reach a predetermined read voltage level. In Process 1740, the method includes coupling the first word line to a floating voltage terminal and, in Process 1750, waiting for a second predetermined period of time to allow the first word line to discharge. For example, the second predetermined period of time is indicated as $T_{delay2}$ in FIG. 15. In Process 1760, a memory read operation is performed for sensing a current associated with the first word line. In Process 1770, the sense current is compared with a predetermined reference current, which has been selected for identifying a word line leakage condition. In Process 1780, the method includes determining whether the word line leakage condition exists. The various currents associated with word line testing are shown in FIG. 16. Similar to discussions associated with FIG. 12, the sense current is compared to a reference current $I_{ref}$ to determine a leakage condition.

In the method described above, various testing parameters can be selected for different testing conditions. For example, the first and second predetermined periods of time for charging up the word lines under testing, as well reference voltage and current levels may be determined experimentally. In a particular example, the second predetermined period of time is about several to hundreds μsec according to the detecting leakage criterion and word line capacitance. In an embodiment, the predetermined reference current is selected to be higher than intrinsic leakage current as well as proper working range applies to sense amplifier. In another specific embodiment, the predetermined reference current is about 10 μA. Of course, there can be other variations, modifications, and alternatives.

The above sequence of processes provides word line leakage detection method according to an embodiment of the present invention. As shown, the method uses a combination of steps including a way of charging up selected word lines, waiting for the word lines to discharge, and then observing the word line voltage to determine a leakage condition. Other alternatives can also be provided where steps are added, one or more steps are removed, or one or more steps are provided in a different sequence without departing from the scope of the claims herein.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A method for detecting word line leakage in a memory device, the method comprising:
   coupling a first word line in the memory device to a voltage source while coupling a second word line in the memory device to a ground level voltage;
   decoupling the first word line from the voltage source; and
   comparing a current of the first word line with a predetermined reference current for determining a leakage condition of the word line.

2. The method of claim 1 wherein the first word line is adjacent to the second word line.

3. The method of claim 1, further comprising a step of waiting for a first time period after coupling the first word line to the voltage source, and a step of waiting for a second time period after decoupling the first word line to the voltage source.

4. The method of claim 3, wherein the second time period is about 10 to 200 μsec or greater according to the detecting leakage criterion and word line capacitance.

5. The method of claim 1, further comprising coupling a plurality of first word lines and a plurality of second word lines to the voltage source and ground level voltage, respectively.

6. The method of claim 5, wherein the plurality of first word lines are even-numbered word lines in the memory device, and wherein the plurality of second word lines are odd-numbered word lines in the memory device.

7. The method of claim 1, further comprising a sensing step to perform a memory read operation to determine a current associated with a bit line coupled to the first word line.

8. The method of claim 1 wherein the second time period is selected to allow a voltage associated with the first word line to be discharged for identifying the word line leakage condition.

9. The method of claim 1, wherein the predetermined reference current is higher than an intrinsic leakage current associated with the first word line.

10. The method of claim 1 wherein the predetermined reference current is about 10 μA base on sense amplifier operation range.

11. A method of detecting a word line leakage in a memory device, comprising:
- charging a first word line in the memory device;
- discharging a second word line in the memory device; and
- comparing a current in the charged first word line with a predetermined reference current.

12. The method of claim 11, wherein the first word line is adjacent to the second word line.

13. The method of claim 11, wherein the predetermined reference current being higher than an intrinsic leakage current associated with the first word line.

14. The method of claim 11, further comprising charging a plurality of first word lines and discharging a plurality of second word lines.

15. The method of claim 14, wherein the plurality of first word lines are even-numbered word lines in the memory device, and wherein the plurality of second word lines are odd-numbered word lines in the memory device.

16. A memory device comprising:
- means for charging a first word line in the memory device;
- means for discharging a second word line in the memory device; and
- means for comparing a current in the charged first word line with a predetermined reference current.

17. The memory device of claim 16, wherein the first word line is adjacent to the second word line.

18. The memory device of claim 16, wherein the predetermined reference current being higher than an intrinsic leakage current associated with the first word line.

19. The memory device of claim 16, further comprising means for charging a plurality of first word lines and means for discharging a plurality of second word lines.

20. The memory device of claim 19, wherein the plurality of first word lines are even-numbered word lines in the memory device, and wherein the plurality of second word lines are odd-numbered word lines in the memory device.

* * * * *